US008546756B2

(12) United States Patent
Shur et al.

(10) Patent No.: US 8,546,756 B2
(45) Date of Patent: Oct. 1, 2013

(54) SYSTEM AND METHOD FOR MATERIAL ANALYSIS OF A MICROSCOPIC ELEMENT

(75) Inventors: Dmitry Shur, Holon (IL); Yaron Cohen, Givat Brener (IL)

(73) Assignee: Applied Materials Israel, Ltd., Rehovot (IL)

( * ) Notice: Subject to any disclaimer, the term of this patent is extended or adjusted under 35 U.S.C. 154(b) by 279 days.

(21) Appl. No.: 12/864,215

(22) PCT Filed: Jan. 22, 2009

(86) PCT No.: PCT/IL2009/000094
§ 371 (c)(1),
(2), (4) Date: Sep. 21, 2010

(87) PCT Pub. No.: WO2009/093247
PCT Pub. Date: Jul. 30, 2009

(65) Prior Publication Data
US 2011/0024622 A1    Feb. 3, 2011

Related U.S. Application Data

(60) Provisional application No. 61/022,550, filed on Jan. 22, 2008.

(51) Int. Cl.
*H01J 37/26* (2006.01)
(52) U.S. Cl.
USPC ........... 250/307; 250/306; 250/310; 250/311; 250/397; 250/399
(58) Field of Classification Search
USPC .................... 250/306, 307, 310, 311, 440.11, 250/442.11, 396 R, 397, 398, 399, 400, 396 ML, 492.1, 492.2, 492.3
See application file for complete search history.

(56) References Cited

U.S. PATENT DOCUMENTS

| 4,807,159 A * | 2/1989 | Komatsu et al. ............ 250/311 |
| 6,448,555 B1 * | 9/2002 | Hosokawa ...................... 850/9 |
| 6,924,484 B1 * | 8/2005 | Wang et al. ...................... 850/9 |
| 2001/0003655 A1 * | 6/2001 | Tokunaga ........................ 438/1 |

(Continued)

FOREIGN PATENT DOCUMENTS

EP    0 996 142 A    4/2000

OTHER PUBLICATIONS

Applied Materials Israel, Ltd.; PCT/IL2009/000094 filed Jan. 22, 2009; International Search Report and Written Opinion; ISA/EP; Jun. 5, 2009; 14pp.

*Primary Examiner* — Michael Logie
(74) *Attorney, Agent, or Firm* — Kilpatrick Townsend & Stockton LLP (57) ABSTRACT

A system and a method for material analysis of a microscopic element, the method comprising: illuminating an area that includes at least a portion of the microscopic element by a charged particle beam, detecting particles that are generated in the area in response to the charged particle beam and analyzing the detected particles to provide an indication about a material characteristic of the microscopic element, wherein the operation of illumination is implemented as a sequence of displacement compensation determination periods, each provided between consecutive material analysis periods, the method further comprising evaluating during a displacement compensation determination period, a displacement of the charged particle beam with respect to the microscopic element and during a consecutive material analysis period applying a spatial adjustment measure as required, thereby compensating for a drift of the charged particle beam.

20 Claims, 8 Drawing Sheets

(56) References Cited

U.S. PATENT DOCUMENTS

| | | |
|---|---|---|
| 2005/0276932 A1* | 12/2005 | Takaoka et al. ............... 427/585 |
| 2006/0219907 A1* | 10/2006 | Ogashiwa et al. ............ 250/310 |
| 2007/0023689 A1* | 2/2007 | Iizuka et al. ............... 250/491.1 |
| 2007/0114460 A1* | 5/2007 | Muramatsu et al. ...... 250/492.22 |
| 2008/0217535 A1* | 9/2008 | Sato et al. ..................... 250/310 |

* cited by examiner

SYSTEM AND METHOD FOR MATERIAL ANALYSIS OF A MICROSCOPIC ELEMENT

CROSS REFERENCES TO RELATED APPLICATIONS

The present patent application is a National Stage under 35 USC 365 and claims priority to PCT International Application No. PCT/IL2009/00094 filed Jan. 22, 2009, incorporated herein by reference, which claims priority benefit from U.S. Provisional Application No. 61/022,550 filed Jan. 22, 2008.

FIELD OF THE INVENTION

The invention relates to methods and systems for material analysis of a microscopic element.

BACKGROUND OF THE INVENTION

Integrated circuits are manufactured by a highly complex manufacturing process. Various manufacturing process faults can result in the deposition of microscopic elements on the integrated circuits. Solving these various manufacturing faults can be assisted by determining the materials from which these microscopic elements are made of.

Various material analysis methods focus on a charged particle beam (such as an electron beam or an ion beam) or an X-ray beam onto a microscopic element of interest. This charged particle beam typically charges the microscopic element and additionally or alternatively, specimen portions that are proximate to that microscopic element. This charging can deflect the charged particle beam from the microscopic element. Thus, after a certain period the charged particle beam can totally miss the element of interest and the material analysis will not reflect the materials from which the microscopic element is made of.

Figure 1:
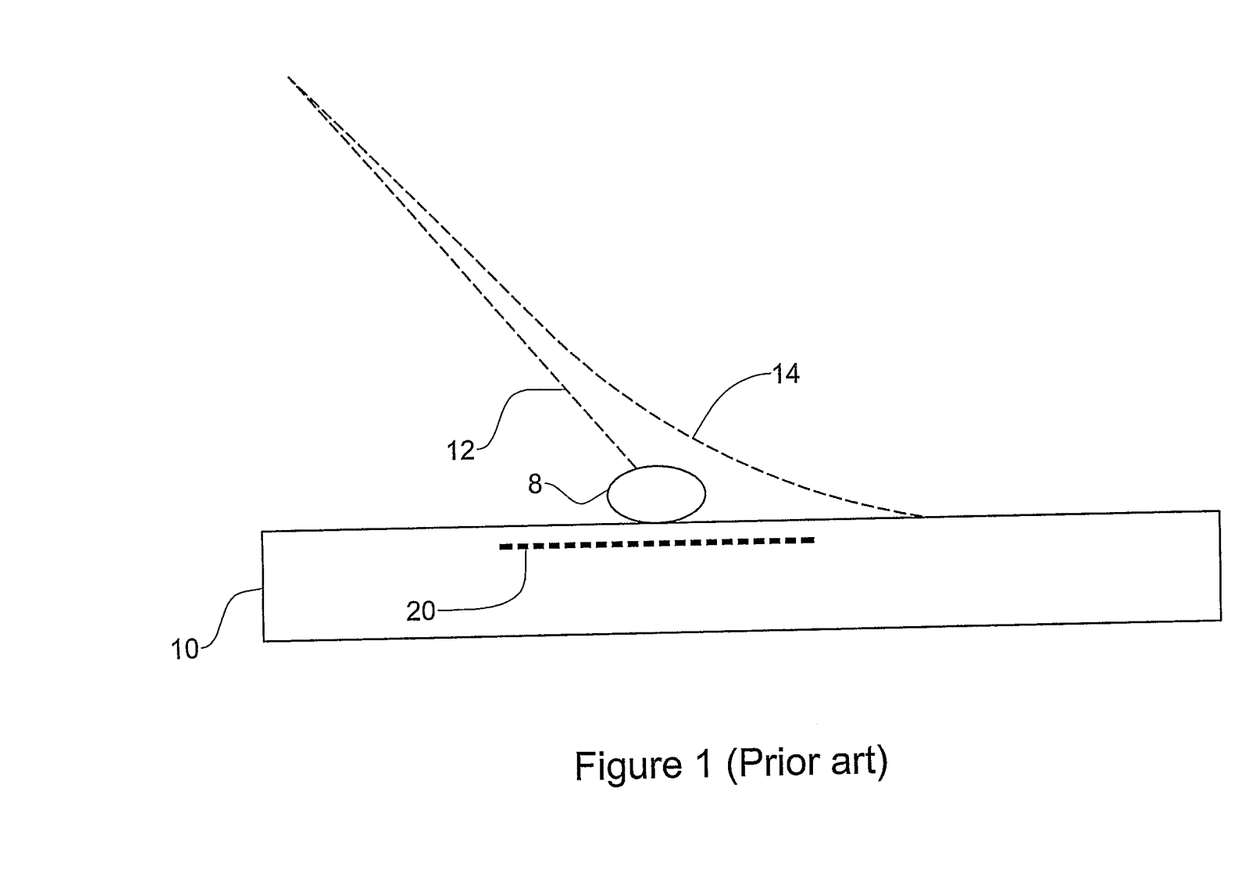
FIG. 1 illustrates a prior art microscopic element and a displacement of a charged particle beam over time.

FIG. 1 illustrates microscopic element 8 and a displacement of a charged particle beam over time. At a beginning of the illumination, a charged particle beam (illustrated by dashed line 12) is directed towards microscopic element 8. The charged particle beam charges a portion 20 of specimen (illustrated by a horizontal dashed line below microscopic element 8). The charged portion 20 generates an electrical field that displaces the charged particle beam. After a while the charged particle beam (illustrated by dashed line 14) is directed towards the surrounding of the microscopic element and does not interact with microscopic element 8.

Figure 2:
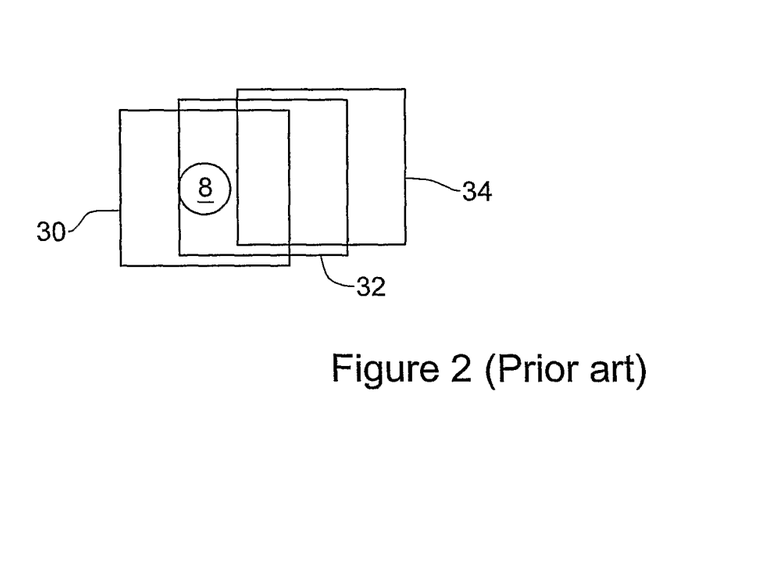
FIG. 2 illustrates a prior art microscopic element and various areas that are scanned during different points in time, due to the displacement of the charge particle beam.

FIG. 2 illustrates the microscopic element and various areas that are scanned during different points in time, due to the displacement of the charge particle beam. The displacement results e.g. from the charging of the specimen (or a portion thereof). When the scanning starts microscopic element 8 is located at the center of area 30. After a while, the scanning electron microscope is directed towards another area 32 and microscopic element 8 is not located at the center to this area. After additional time microscopic element 8 is completely outside area 36 that is scanned by the charged electron beam. It is noted that this displacement, which in this example resulted from charging effects, is not the result of a deliberate alteration of a parameter of charged particle beam optics.

Figure 3:
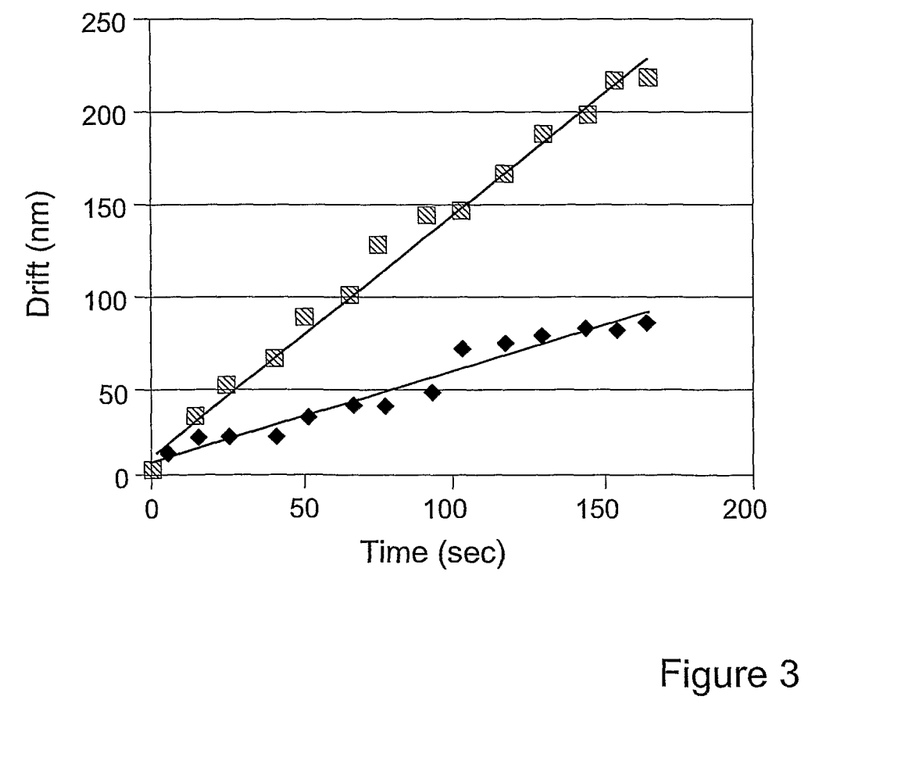
FIG. 3 illustrates a displacement rate (drift) of an electron beam.

FIG. 3 illustrates an example of the displacement (drift) of an electron beam measured in a blanket silicon glass wafer that was tilted at about forty five degrees in relation to a scanning electron microscope column. The drift rate along the Y axis was about 1.4 nanometers per second while the drift rate along the X axis was lower. It is expected that if a small microscopic element area is to be scanned by electron beam (for example, electron beam spot placed within microscopic element of 30 nm×30 nm) for material analysis, then after about 10 seconds the microscopic element will be out of the electron beam spot. It is further expected that the drift rate will be much faster when scanning a more easily charging specimen such as those made of low K dielectric materials.

There is a growing need to provide a system and a method for material analysis on small microscopic elements (for example, about 50 nm and less).

BRIEF DESCRIPTION OF THE DRAWINGS

In order to understand the invention and to see how it may be carried out in practice, an embodiment will now be described, by way of non-limiting example only, with reference to the accompanying drawings, in which.

SUMMARY OF THE INVENTION

According to an embodiment of the invention there is provided a method for material analysis of a microscopic element, the method comprising: illuminating an area that includes at least a portion of the microscopic element by a charged particle beam, detecting particles that are generated in the area in response to the charged particle beam and analyzing the detected particles to provide an indication about a material characteristic of the microscopic element, wherein the operation of illumination is implemented as a sequence of displacement compensation determination periods, each provided between consecutive material analysis periods, the method further comprising evaluating during a displacement compensation determination period, a displacement of the charged particle beam with respect to the microscopic element and during a consecutive material analysis period applying a spatial adjustment measure as required, thereby compensating for a drift of the charged particle beam.

According to an embodiment of the invention, the operation of evaluating a displacement of the charged particle beam with respect to the microscopic element comprises assessing a change in a detected location of the microscopic element before and after one or more material analysis periods.

According to an embodiment of the invention, the length of an area illuminated during one or more the displacement compensation determination period is one of the following: (1) large enough to include a substantial portion of the microscopic element despite the drift of the charged particle beam;

(2) larger by about a factor of 10 than a length of an area illuminated during one or more the material analysis periods; (3) larger by about a factor of than a width of the microscopic element; (4) between 250 nm to 1000 nm, and a length of an area illuminated during one or more the material analysis periods is between 30 nm to 40 nm.

According to an embodiment of the invention, the illumination is provided in spot mode of charged particle beam optics during the material analysis periods and in scan mode of charged particle beam optics during the displacement compensation determination periods.

According to another embodiment of the invention, the method further comprises calculating a displacement rate of the charged particle beam, and determining a desired length of the material analysis periods so that a significant portion of the microscopic element is illuminated throughout the material analysis periods.

According to an embodiment of the invention, the application of the spatial adjustment during a material analysis period comprises providing compensation signals to charged electron beam optics to thereby directing the charged particle beam towards the area that includes the microscopic element during a significant portion of that material analysis period.

According to an embodiment of the invention, the method further comprises determining the length of the material analysis period in response to an expected displacement rate of the charged particle beam and in response to a spatial characteristic of the spatial compensation insignificant area. According to another embodiment, the method comprises determining a length of the displacement compensation determination period in response to the displacement of the charged particle beam during the first material analysis period.

According to an embodiment of the invention there is provided a system for material analysis of a microscopic element, the system comprising: a charged particle optics including a deflecting element for illuminating an area with a charged particle beam in a sequence of displacement compensation determination periods, each provided between consecutive material analysis periods and for deflecting the charged particle beam in response to a control signal provided by a voltage supply unit; a material analysis detector for detecting particles generated in the area in response to the charged particle beam; a processor unit coupled to the material analysis detector and the voltage supply unit and configured to analyze the particles detected by the material analysis detector to provide an indication about a material characteristic of the microscopic element, the processing unit further configured to evaluate, during a displacement compensation determination period, a displacement of the charged particle beam with respect to the microscopic element and during a consecutive material analysis period, to provide compensation signals to the voltage supply unit, thereby compensating for a drift of the charged particle beam.

According to an embodiment of the invention, the processor (processing unit) is adapted in evaluating the displacement, to assessing a change in a detected location of the microscopic element before and after one or more material analysis periods. According to another embodiment, the processing unit is further configured to control the length of one or more of the material analysis period and/or one or more of the displacement compensation determination periods. According to yet another embodiment, the processing unit is further configured to control the length of an area illuminated during one or more of the material analysis period and/or one or more of the displacement compensation determination periods. According to an embodiment of the invention, the processing unit is further configured to calculate a displacement rate of the charged particle beam and determine a desired length of the material analysis periods so that a significant portion of the microscopic element is illuminated throughout the material analysis periods. According to an embodiment of the invention, the processing unit is adapted to determine the length of the material analysis period in response to an expected displacement rate of the charged particle beam and in response to a spatial characteristic of the spatial compensation insignificant area. According to yet another embodiment, the processing unit is adapted to determine a length of the displacement compensation determination period in response to the displacement of the charged particle beam during the first material analysis period.

According to an embodiment of the invention there is provided system and a method for material analysis of a microscopic element, the method includes: illuminating, during a material analysis period, by a charged particle beam at least one spatial compensation insignificant area that comprise a portion (here significant lateral area is not necessary) of the microscopic element and detecting particles that are generated in response to an interaction between the at least one spatial compensation insignificant area and the charged particle beam; wherein the illuminating results in a displacement of the charged particle beam in relation to the microscopic element; illuminating, during at least a portion of a displacement compensation determination period, at least one spatial compensation significant area that comprises at least a significant portion of the microscopic element by the charged particle beam and detecting particles that are generated in response to an interaction between the least one spatial compensation significant area and the charged particle beam; determining a spatial adjustment measure of the charged particle beam required for at least partially compensating for the displacement of the charged particle beam during the illumination of the at least one spatial compensation insignificant area; illuminating, during another material analysis period, at least one spatial compensation insignificant area that comprises a portion of the microscopic element, by the charged particle beam and detecting particles that are generated in response to an interaction between the at least one spatial compensation significant area and the charged particle beam; and applying the spatial adjustment measure during at least a portion of the other material analysis period; wherein an analysis of particles detected in response to an illumination of at least one spatial compensation insignificant area provides an indication about a material characteristic of the microscopic element.

DETAILED DESCRIPTION OF THE DRAWINGS

It should be understood that the class of embodiments described herein provides only a few examples of the many advantageous uses of the innovative teachings herein. In general, statements made in the specification of the present application do not necessarily delimit any of the various claimed inventions. Moreover, some statements may apply to some inventive features but not to others.

In the following, the invention would be described mainly with reference to compensate for charging drifts. It should be noted that the invention is not limited by the root cause of the drift and is equally applicable to compensating for drifts caused by a phenomenon of different origin.

The term "spatial compensation insignificant area" means an area whose image can not assist in determining a spatial compensation required for compensating for a charged particle beam displacement. Conveniently, this area is smaller than a minimal area that when imaged can provide information that can assist in determining the spatial compensation. Typically, a spatial compensation insignificant area is illuminated during a spot mode of charged particle beam optics. Typically, the spatial compensation insignificant area is not substantially larger than the microscopic particle of interest. Typically, during a relatively short period, a charged particle beam that is initially directed towards such a spatial compensation insignificant area is displaced (e.g. due to charging effects) so that it eventually (at the end of the short period) does not illuminate the spatial compensation insignificant area. For example, the length of such a compensation insignificant area can be few nanometers. Conveniently, such an area is illuminated when a charged particle beam optic operates in a spot mode—the charged particle beam is not scanned. Conveniently a spatial compensation insignificant area can be few tenths of nanometers long (for example about 30 nm×30 nm till 40 nm×40 nm) but this is not necessarily so. The spot size can be few nanometers wide (for example 4-10 nm wide).

The term "spatial compensation significant area" means an area whose image can assist in determining a spatial compensation required for compensating for a charged particle beam displacement. A spatial compensation significant area is larger and even is significantly larger than a spatial compensation insignificant area. It is large enough to include at least a significant, substantial portion of the microscopic element of interest despite the displacement of the charged electron beam. For example, the length of such a compensation significant area can be a few tens of nanometers. Conveniently a spatial compensation significant area can be a few hundreds of nanometers long (for example about 250 nm×250 nm up to 1000 nm×1000 nm) but this is not necessarily so. The spot size can be a few nanometers wide (for example 4-10 nm wide). Images can be acquired at a rate of a few tenths of hertz (for example 30 millisecond per frame) and a few frames can be acquired per a portion of a spatial compensation determination period.

The term "material characteristic" means any characteristic that can assist in determining a material from which an element is made.

Figure 4:
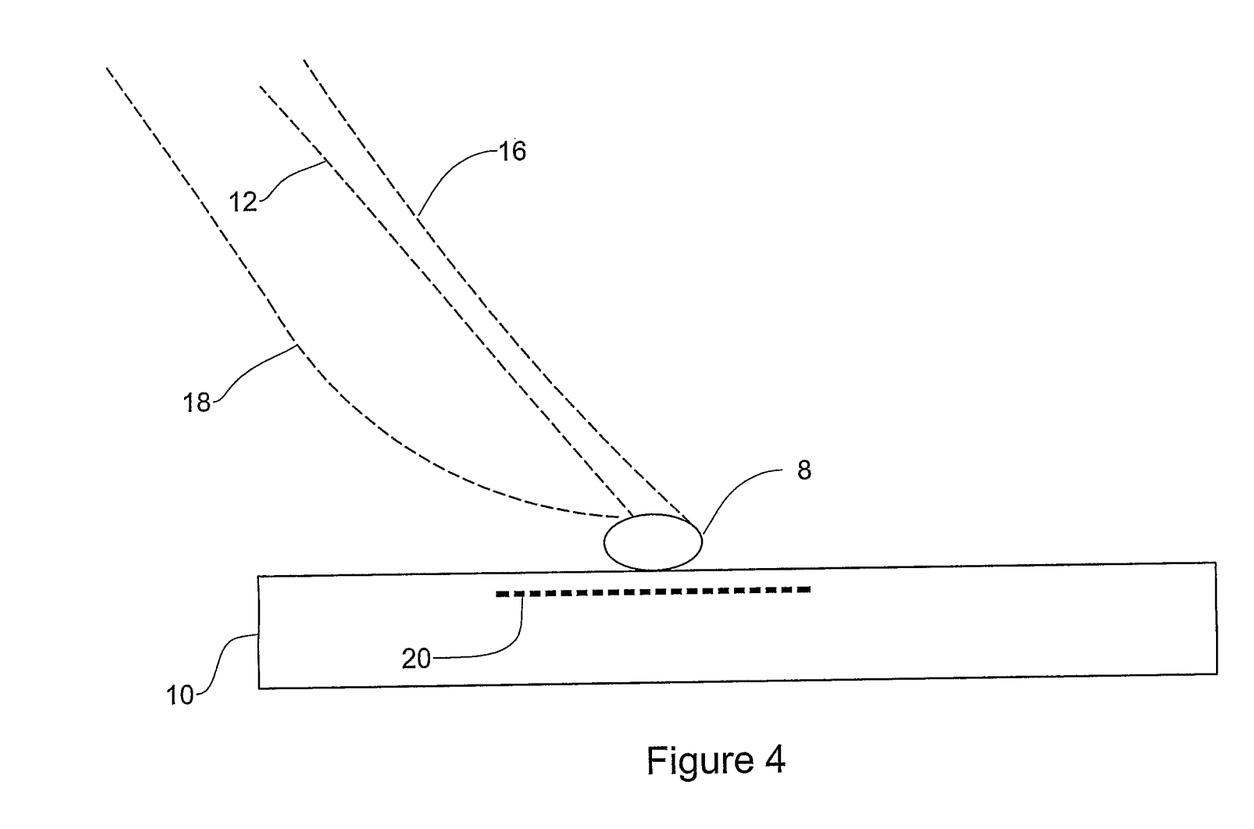
FIG. 4 illustrates in a schematic manner a microscopic element and a displacement compensated charged electron beam according to an embodiment of the invention.
Figure 5:
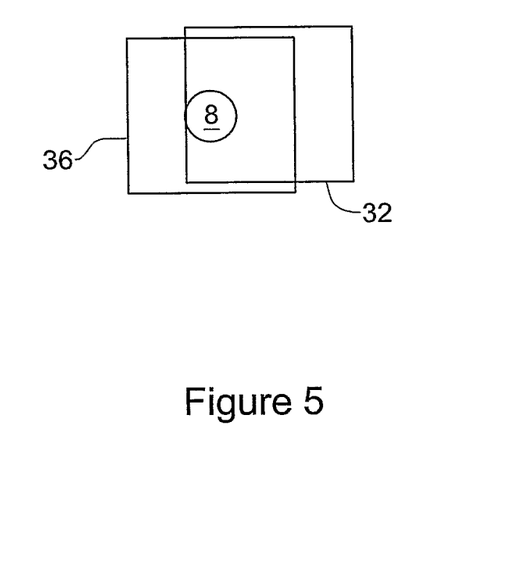
FIG. 5 illustrates the microscopic element and areas that are scanned during material evaluation periods according to an embodiment of the invention.

FIGS. 4 and 5 illustrate an example of an application of a spatial compensation measure. Such a measure is applied by executing method 100 or at least some stage of method 600.

FIG. 4 illustrates microscopic element 8 and displacement compensated charged electron beam according to an embodiment of the invention. At the beginning of a material analysis period, charged particle beam 12 is directed towards microscopic element 8. During such a material analysis period the charged particle beam charges a portion 20 of specimen. The charged portion 20 generates an electrical field that displaces the charged particle beam during at least the material analysis period (as illustrated by dashed line 16). This material analysis period is followed by a displacement compensation determination period and an application of a spatial adjustment measure. This measure causes the charged particle beam to be directed onto microscopic element 8 despite the above mentioned displacement, as illustrated by curved line 18.

FIG. 5 illustrates microscopic element 8 and areas 32 and 36 that are scanned during material evaluation periods according to an embodiment of the invention. At the end of a material analysis period area 36 is scanned. At the beginning of this material analysis period, another area (not shown) was scanned—microscopic element 8 was placed in the middle of that area. After the material analysis period ends, a displacement compensation determination period starts and a spatial adjustment measure is applied. This measure causes the charged particle beam to be directed onto spatial compensation insignificant area 36 wherein microscopic element 8 is located at the center of that area.

Figure 6:
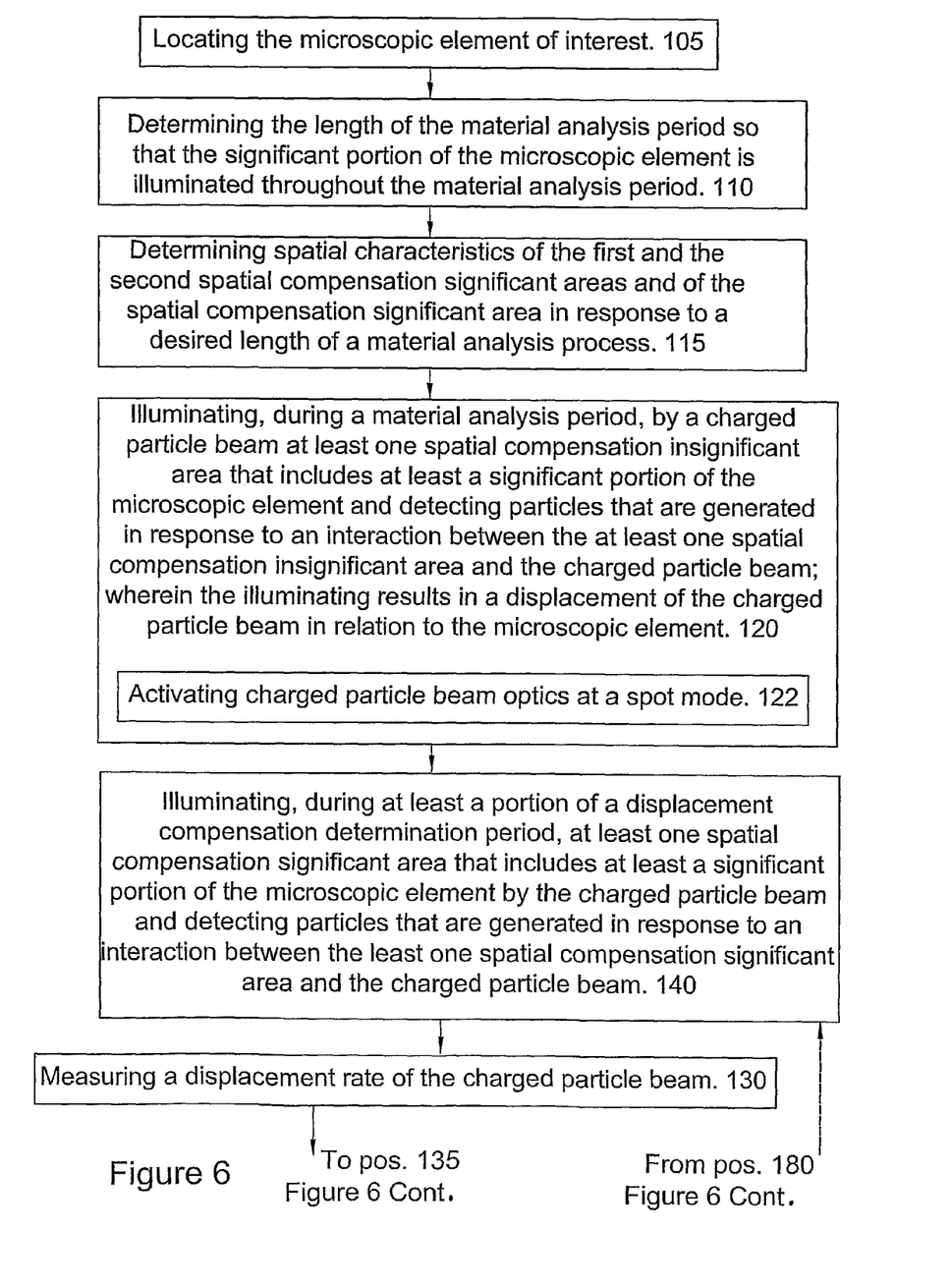
FIG. 6 illustrates a method for material analysis according to an embodiment of the invention.

FIG. 6 illustrates method 100 for material analysis according to an embodiment of the invention.

Method 100 starts by stage 105 of locating the microscopic element of interest.

Method 100 can also start by one or more additional initialization stages such as but not limited to stages 110 and 115.

Stage 110 includes determining the length of one or more material analysis periods so that the significant portion of the microscopic element is illuminated throughout each material analysis period.

Stage 115 includes determining spatial characteristics of the first and the second spatial compensation insignificant areas and of the spatial compensation significant area in response to a desired length of a material analysis process.

Stages 110 and 115 are followed by stage 120 of: (i) illuminating, during a material analysis period, by a charged particle beam, at least one spatial compensation insignificant area that includes at least a significant portion of the microscopic element and (ii) detecting particles that are generated in response to an interaction between the at least one spatial compensation insignificant area and the charged particle beam. The illuminating results in a displacement (due to charging effects) of the charged particle beam in relation to the microscopic element. It is noted that more than one spatial compensation insignificant area can be illuminated due to the displacement of the charged particle beam. Thus, when the material analysis period starts, one compensation insignificant area is illuminated and at the end of this period, another (shifted away) compensation insignificant area is illuminated. The detection can involve detecting x-rays, auger electrons, backscattered electrons, photons and the like. One or more detectors (of one or more types) can be used.

Conveniently stage 120 includes activating charged particle beam optics at a spot mode, as illustrated by box 122.

Stage 120 is followed by stage 140 of (i) illuminating, during at least a portion of a displacement compensation determination period, at least one spatial compensation significant area that includes at least a significant portion of the microscopic element by the charged particle beam and (ii) detecting particles that are generated in response to an interaction between the least one spatial compensation significant area and the charged particle beam.

Stage 140 can be followed by either one of stages 130, 135, 150 and 160.

Figure 7:
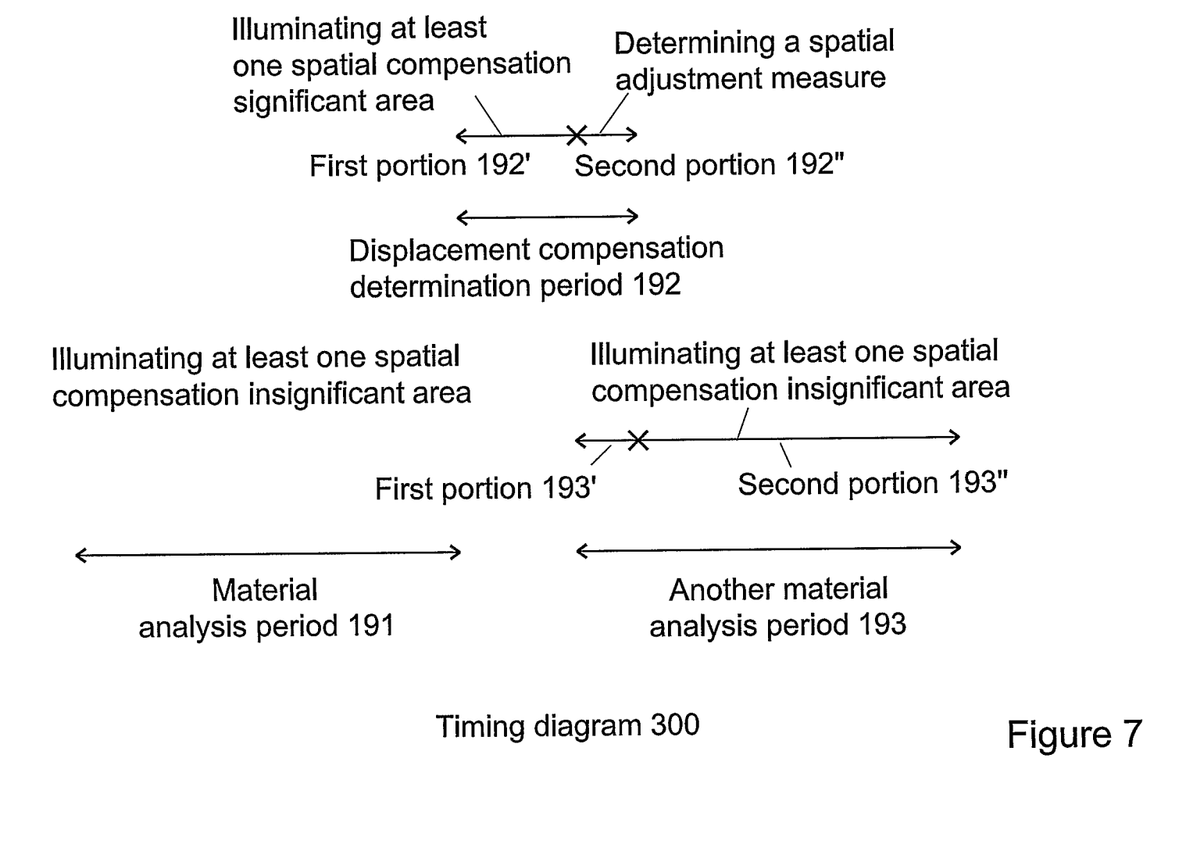
FIG. 7 is a timing diagram that illustrates the timing of various stages of the method of FIG. 6, according to an embodiment of the invention.

If stage 120 is immediately followed by stage 160 then either one of stages 130, 135, 150 and even 170 is executed in parallel to stage 160. In this case one or more stages out of stages 130, 135 and especially 150 are executed during a portion of another material analysis period while stage 170 is executed during another portion of the other material analysis period. The last scenario is illustrated in the timing diagram of FIG. 7. During a material analysis period 191 at least one spatial compensation insignificant area is illuminated. Once that period ends, a first portion 192' of a displacement compensation determination period 192 starts. During first portion 192' at least one spatial compensation significant area is illuminated and images of one or more spatial compensation significant areas are acquired. After first portion 192' ends, another material analysis period 193 starts. A first portion 193' of other material analysis period 193 and a second portion 192" of displacement compensation determination period 192 overlap. During second portion 192" the images that were acquired during first portion 192' are processed in order to determine the spatial compensation measure to be applied during second portion 193" of the other material analysis period 193. According to another embodiment of the invention (not illustrated by FIG. 7) the other material analysis period and the displacement compensation determination period do not overlap.

Stage 130 includes calculating a displacement rate of the charged particle beam.

Stage 135 includes determining a length of the other material analysis period in response to the displacement of the charged particle beam during the material analysis period.

Stage 150 includes determining the length of the other material analysis period in response to an expected displacement rate of the charged particle beam and in response to a spatial characteristic of at least one spatial compensation insignificant area.

Stage 160 includes determining a spatial adjustment measure of the charged particle beam required for at least partially compensating for the displacement of the charged particle beam during illumination of the at least one spatial compensation insignificant area.

Stage 160 is followed by stages 170 and 180.

Stage 180 includes illuminating, during another material analysis period, at least one spatial compensation insignificant area that includes at least a significant portion of the microscopic element, by the charged particle beam and detecting particles that are generated in response to an interaction between the at least one spatial compensation significant area and the charged particle beam. An analysis of particles detected in response to an illumination of at least one spatial compensation insignificant area provides an indication about a material characteristic of the microscopic element.

Stage 170 includes applying the spatial adjustment measure during at least a portion of the other material analysis period. Stage 170 can include stage 172 of providing compensation signals to charged electron beam optics that direct the charged particle beam towards the second spatial compensation insignificant area. Thus, if changes in the supply voltage are used to scan the charged particle beam (for example—perform raster scan) then bias voltages can introduce X and Y shifts that will compensate for charged particle beam displacement.

It is noted that a material analysis process can require a repetition of multiple stages out of the above mentioned stages and multiple material analysis periods and multiple displacement compensation determination periods will be required before sufficient information is gathered for performing the material analysis.

Stages 170 and 180 (or multiple iterations of the above mentioned stages) are followed by stage 190 of determining a material characteristic of the microscopic element in response to particles detected during multiple material analysis periods.

According to another embodiment of the invention, the result of one displacement compensation determination period can be compared to more than one result or more than one previous displacement compensation determination period. Thus, for example, if the gap between the results of two consecutive displacement compensation determination periods is too big or otherwise not reasonable, a comparison can be made to one or more results or even older displacement compensation determination periods so as to ignore unreasonable results. It is noted that other reasons can trigger a comparison between results of more than two displacement compensation determination periods. Yet for another example such a comparison can be made each time. It is noted that the comparison can include assigning weights to each result and comparing the weighted results. Yet according to another embodiment of the invention, various analysis methods can be applied on multiple results of multiple displacement compensation determination periods in order to determine the required spatial compensation measure.

Figure 8:
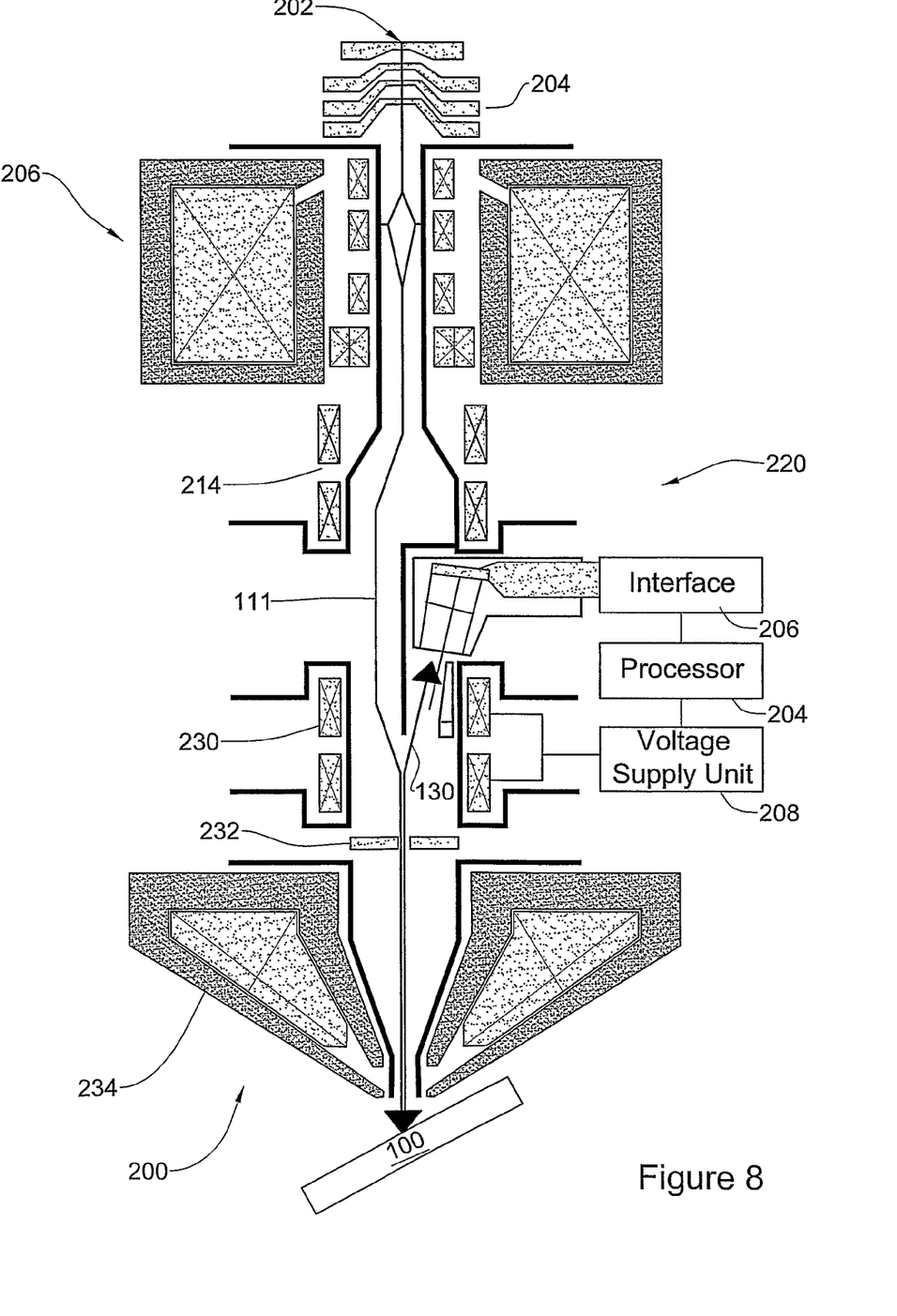
FIG. 8 illustrates a system according to an embodiment of the invention.

FIG. 8 illustrates system 200 according to an embodiment of the invention.

For simplicity of explanation it is assumed that system 200 is a scanning electron microscope (SEM) and that the charged electron beam is an electron beam.

Electron beam optics includes electron source 202, various electrons and magnetic lenses such as 204, 206, 214, 230 and 234. Objective lens 234 is preceded by deflecting coils 230. These deflecting coils are adapted to scan the charged particle beam 111. These deflecting coils can receive a bias signal (from voltage supply unit 208) that shifts the charged electrical beam so that it illuminates a microscopic element. Voltage supply unit 208 also provides a signal that causes the charged particle beam to scan an area.

System 200 includes a so-called in-lens detector 232 that includes an aperture through which the charged particle beam and some particles, which are scattered from an illuminated area pass. A material analysis detector 220 can receive some of these particles and generates detection signals that are provided to interface 206. Interface 206 can store these signals or otherwise provide these signals to processor 204. It is noted that processor 204 can include multiple computerized entities such as a controller, a material analyzer and the like.

During a material analysis period the charged particle beam optics illuminates a first spatial compensation insignificant area that comprises at least a significant portion of the microscopic element, by a charged particle beam, at least one detector (such as detector 220) detects particles that are generated in response to an interaction between the first spatial compensation insignificant area and the charged particle beam; wherein the illumination results in a displacement of the charged particle beam in relation to the microscopic element.

During at least one portion of the displacement compensation determination period the charged particle beam optics illuminates a spatial compensation significant area that comprises at least a significant portion of the microscopic element, by the charged particle beam, the at least one detector (such as detector 220) detects particles that are generated in response to an interaction between the spatial compensation significant area and the charged particle beam.

Processor 204 determines a spatial adjustment of the charged particle beam required for at least partially compensating for the displacement of the charged particle beam during the material analysis period. The determination is based upon image processing and especially upon the assessment of the change in the relative location of the microscopic element before and after the material analysis period.

During at least a portion of another material analysis period, system 200 (and especially voltage supply unit 208 that supplies at least a compensation voltage to deflector coils 230) applies a spatial adjustment measure.

During the other material analysis period the charged particle beam optics illuminates a second spatial compensation insignificant area that comprises at least a significant portion of the microscopic element, by the charged particle beam and the at least one detector (such as detector 220) detects particles that are generated in response to an interaction between the second spatial compensation significant area and the charged particle beam.

Wherein an analysis of particles detected during the first and the second material analysis periods provides an indication about a material characteristic of the microscopic element.

Conveniently, processor 204 is adapted to determine the length of the material analysis period in response to an expected displacement rate of the charged particle beam and in response to a spatial characteristic of the spatial compensation insignificant area.

Conveniently, processor 204 is adapted to determine the length of the material analysis period so that at least a significant portion of the microscopic element is illuminated throughout the material analysis period.

Conveniently, processor 204 is adapted to calculate a displacement rate of the charged particle beam.

Conveniently, system 200 is adapted to apply the spatial adjustment by providing compensation signals to the charged electron beam optics.

Conveniently, processor 204 is adapted to determine spatial characteristics of each spatial compensation significant area and of each spatial compensation insignificant area in response to a desired length of a material analysis process.

Conveniently, the material analysis period is much longer than the displacement compensation determination period.

Conveniently, processor 204 is adapted to determine a length of the displacement compensation determination period in response to the displacement of the charged particle beam during the first material analysis period.

Conveniently, the charged particle beam optics is activated at a spot mode during the material analysis period.

Conveniently, processor 204 is further adapted to determine a material characteristic of the microscopic element in response to particles detected during the material analysis periods.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A method for material analysis of a microscopic element, the method comprising:
    illuminating an area that includes at least a portion of the microscopic element by a charged particle beam, detecting particles that are generated in the area in response to the charged particle beam and analyzing the detected particles to provide an indication about a material characteristic of the microscopic element,
    wherein the operation of illumination is implemented as a sequence of scan mode illumination periods, each provided between consecutive spot mode illumination periods,
    the method further comprising evaluating, based on images taken during said scan mode illumination periods, a displacement of the charged particle beam with respect to the microscopic element and during a spot mode illumination period applying a spatial adjustment measure as required, thereby compensating for a drift of the charged particle beam.

2. The method according to claim 1 wherein said evaluating a displacement of the charged particle beam with respect to the microscopic element comprises comparing between one or more of said images and assessing a change in a location of the microscopic element.

3. The method according to claim 2 wherein said comparing between one or more of said images comprises comparing an image taken during a scan mode illumination period to one or more images taken before a previous spot mode illumination period.

4. The method according to claim 3 further comprising:
    calculating a displacement rate of the charged particle beam, and determining a desired length of the spot mode illumination periods so that a significant portion of the microscopic element is illuminated throughout the spot mode illumination periods.

5. The method according to claim 4 wherein applying of the spatial adjustment during a spot mode illumination period comprises providing compensation signals to a charged electron beam optics to thereby directing the charged particle beam towards the area that includes the microscopic element during a significant portion of that material analysis period.

6. The method according to claim 5 further comprising: determining the length of the spot mode illumination period in response to an expected displacement rate of the charged particle beam.

7. The method according to claim 6 further comprising: determining a length of the scan mode illumination period.

8. The method according to claim 1 wherein a length of an area illuminated during one or more of said scan mode illumination periods is one of the following:
    i. large enough to include a substantial portion of the microscopic element despite the drift of the charged particle beam;
    ii. larger by about a factor of 10 than a length of an area illuminated during one or more said spot mode illumination periods;
    iii. larger by about a factor of 10 than a width of the microscopic element;
    iv. between 250 nm to 1000 nm, and a length of an area illuminated during one or more said spot mode illumination periods is between 30 nm to 40 nm.

9. The method according to claim 1 wherein said detecting comprises detecting one of x-rays, auger electrons, backscattered electrons or photons, which are generated in the area in response to the charged particle beam.

10. A system for material analysis of a microscopic element, the system comprising:
    a charged particle optics including a deflecting element for illuminating an area with a charged particle beam in a sequence of scan mode illumination periods, each provided between consecutive spot mode illumination periods and for deflecting the charged particle beam in response to a control signal provided by a voltage supply unit;
    a material analysis detector for detecting particles generated in the area in response to the charged particle beam;
    a processor unit coupled to the material analysis detector and the voltage supply unit and configured for analyzing the particles detected by the material analysis detector to provide an indication about a material characteristic of the microscopic element, the processing unit further configured for evaluating, based on images taken during the scan mode illumination periods, a displacement of the charged particle beam with respect to the microscopic element and during a consecutive spot mode illumination period, for providing compensation signals to the voltage supply unit, thereby compensating for a drift of the charged particle beam.

11. The system according to claim 10 wherein the processing unit is further configured, in evaluating said displacement, to assessing a change in a detected location of the microscopic element before and after one or more spot mode illumination periods.

12. The system according to claim 11 wherein the processing unit is further configured to control the length of one or more of the spot mode illumination periods and/or one or more of the scan mode illumination periods.

13. The system according to claim 11 wherein the processing unit is further configured to control the length of an area illuminated during one or more of the spot mode illumination period and/or one or more of the scan mode illumination periods.

14. The system according to claim 13 wherein the length of an area illuminated during one or more of said scan mode illumination periods is one of the following:
   i. large enough to include a substantial portion of the microscopic element despite the drift of the charged particle beam;
   ii. larger by about a factor of 10 than a length of an area illuminated during one or more said spot mode illumination periods;
   iii. larger by about a factor of 10 than a width of the microscopic element;
   iv. between 250 nm to 1000 nm, and a length of an area illuminated during one or more said spot mode illumination periods is between 30 nm to 40 nm.

15. The system according to claim 14 wherein said evaluating comprises comparing an image taken during a scan mode illumination period to one or more images taken before the previous spot mode illumination.

16. The system according to claim 15 wherein the processing unit is further configured for calculating a displacement rate of the charged particle beam and determining a desired length of the spot mode illumination periods so that a significant portion of the microscopic element is illuminated throughout the spot mode illumination periods.

17. The system according to claim 16 wherein the processing unit is configured for providing said compensation signals to the voltage supply unit during a consecutive spot mode illumination period, such that the beam is directed toward an area that includes the microscopic element during a significant portion of that spot mode illumination period.

18. The system according to claim 17 wherein the processing unit is adapted to determine the length of the spot mode illumination period in response to an expected displacement rate of the charged particle.

19. The system according to claim 18 wherein the processing unit is adapted to determine a length of the scan mode illumination period.

20. The system according to claim 10 wherein said material analysis detector is adapted to detect one of s-rays, auger electrons, backscattered electrons or photons, which are generated in the area in response to the charged particle beam.

* * * * *